(12) United States Patent
Blin

(10) Patent No.: US 12,720,842 B2
(45) Date of Patent: Aug. 25, 2026

(54) WIDE BANDGAP TRANSISTOR LAYOUT WITH UNEQUAL GATE ELECTRODE FINGER WIDTHS

(71) Applicant: SKYWORKS SOLUTIONS, INC., Irvine, CA (US)

(72) Inventor: Guillaume Alexandre Blin, Carlisle, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 363 days.

(21) Appl. No.: 18/370,134

(22) Filed: Sep. 19, 2023

(65) Prior Publication Data

US 2024/0113168 A1 Apr. 4, 2024

Related U.S. Application Data

(60) Provisional application No. 63/411,749, filed on Sep. 30, 2022, provisional application No. 63/411,747, filed on Sep. 30, 2022, provisional application No. 63/411,755, filed on Sep. 30, 2022, provisional application No. 63/411,752, filed on Sep. 30, 2022.

(51) Int. Cl.

| | |
|---|---|
| ***H10D 64/23*** | (2025.01) |
| ***H10D 30/47*** | (2025.01) |
| ***H10D 30/60*** | (2025.01) |
| ***H10D 30/65*** | (2025.01) |
| ***H10D 62/10*** | (2025.01) |
| ***H10D 62/13*** | (2025.01) |
| ***H10D 62/85*** | (2025.01) |
| ***H10D 64/27*** | (2025.01) |
| ***H10D 84/83*** | (2025.01) |

(52) U.S. Cl.

CPC ......... *H10D 64/258* (2025.01); *H10D 30/475* (2025.01); *H10D 30/4755* (2025.01); *H10D 30/603* (2025.01); *H10D 30/65* (2025.01); *H10D 62/126* (2025.01); *H10D 62/154* (2025.01); *H10D 62/158* (2025.01); *H10D 62/8503* (2025.01); *H10D 64/257* (2025.01); *H10D 64/411* (2025.01); *H10D 64/519* (2025.01); *H10D 84/834* (2025.01)

(58) Field of Classification Search

CPC .. H10D 30/47; H10D 30/475; H10D 30/4755; H10D 30/603; H10D 30/605; H10D 64/254; H10D 64/257; H10D 64/258

USPC ........................................................... 257/76

See application file for complete search history.

(56) References Cited

U.S. PATENT DOCUMENTS

| | | | |
|---|---|---|---|
| 7,900,176 | B2 | 3/2011 | Kim et al. |
| 12,068,216 | B1 | 8/2024 | Reza |

(Continued)

*Primary Examiner* — Fazli Erdem

(74) *Attorney, Agent, or Firm* — Lando & Anastasi, LLP

(57) ABSTRACT

A transistor comprising a first drain region, a first source region disposed on a first side of the first drain region, a first active region being formed between the first drain region and the first source region, a second source region disposed on a second side of the first drain region opposite the first side, a second active region being formed between the first drain region and the second source region, the first active region having a different width than the second active region, a first gate electrode finger disposed over the first active region, and a second gate electrode finger disposed over the second active region.

20 Claims, 10 Drawing Sheets

(56) References Cited

U.S. PATENT DOCUMENTS

| | | | | |
|---|---|---|---|---|
| 2008/0265314 | A1 | 10/2008 | Kobayashi | |
| 2011/0233559 | A1 | 9/2011 | Ishikura | |
| 2014/0367770 | A1 | 12/2014 | Aoki et al. | |
| 2015/0041917 | A1* | 2/2015 | Zhu | H10D 86/201<br>257/392 |
| 2015/0129965 | A1 | 5/2015 | Roy et al. | |
| 2015/0171898 | A1* | 6/2015 | Blin | H10D 86/01<br>257/390 |
| 2017/0053938 | A1* | 2/2017 | Whitefield | H10D 84/83138 |
| 2017/0250200 | A1 | 8/2017 | Lee et al. | |
| 2018/0374939 | A1 | 12/2018 | Arai et al. | |
| 2019/0206863 | A1* | 7/2019 | Blin | H10D 64/519 |
| 2022/0013415 | A1* | 1/2022 | Blin | H10D 86/01 |
| 2023/0411243 | A1 | 12/2023 | Kabir et al. | |
| 2024/0113169 | A1 | 4/2024 | Blin | |
| 2024/0113181 | A1 | 4/2024 | Blin | |
| 2024/0113190 | A1 | 4/2024 | Blin et al. | |

* cited by examiner 300
110
125
115
115
110
130
105′
110′
110
125
115
115
110
135
105′
110

400
110
115′
125
115
105
142
140
135
130

WIDE BANDGAP TRANSISTOR LAYOUT WITH UNEQUAL GATE ELECTRODE FINGER WIDTHS

CROSS-REFERENCE TO RELATED APPLICATIONS

This application claims priority under 35 U.S.C. § 119 (e) to U.S. Provisional Patent Application Ser. No. 63/411,752, titled "WIDE BANDGAP TRANSISTOR LAYOUT WITH UNEQUAL GATE ELECTRODE FINGER WIDTHS," filed Sep. 30, 2022, to U.S. Provisional Patent Application Ser. No. 63/411,747, titled "WIDE BANDGAP TRANSISTOR LAYOUT WITH STAGGERED GATE ELECTRODE FINGERS AND SPLIT ACTIVE REGIONS," filed Sep. 30, 2022, to U.S. Provisional Patent Application Ser. No. 63/411,749, titled "WIDE BANDGAP TRANSISTOR LAYOUT WITH STAGGERED GATE ELECTRODE FINGERS," filed Sep. 30, 2022, and to U.S. Provisional Patent Application Ser. No. 63/411,755, titled "WIDE BANDGAP TRANSISTOR LAYOUT WITH L-SHAPED GATE ELECTRODES," filed Sep. 30, 2022. The entire content of each of these applications is incorporated herein by reference in its entirety for all purposes.

BACKGROUND

Technical Field

Embodiments of this disclosure relate to transistors having gate electrode finger layouts to optimize active area density and improve thermal management on a die on which the transistors are formed.

Description of Related Technology

Consumers continue to demand increased functionality in devices with reduced form factors. Accordingly, there is a desire in the semiconductor industry to reduce the size of semiconductor die while maintaining or increasing the functionality of circuitry on the die. A reduction in die size also may increase manufacturing yield and reduce total material cost per die, which may be significant in certain high performance semiconductor die, for example, those utilizing a gallium nitride semiconductor layer disposed on a silicon carbide substrate.

SUMMARY

In accordance with one aspect, there is provided a transistor comprising a first drain region, a first source region disposed on a first side of the first drain region, a first active region being formed between the first drain region and the first source region, a second source region disposed on a second side of the first drain region opposite the first side, a second active region being formed between the first drain region and the second source region, the first active region having a different width than the second active region, a first gate electrode finger disposed over the first active region, and a second gate electrode finger disposed over the second active region.

In some embodiments, the first source region has a different width than the second source region.

In some embodiments, the first drain region includes a widthwise extension on the first side of the first drain region that has a smaller length than the length of a remainder of the first drain region.

In some embodiments, the transistor further comprises a drain bond pad disposed at a position displaced in a lengthwise direction from the widthwise extension and displaced in a widthwise direction from a portion of the remainder of the first drain region.

In some embodiments, the remainder of the first drain region has a greater width than the second source region.

In some embodiments, the first source region has a greater width than the second source region.

In some embodiments, the transistor further comprises a second drain region on an opposite side of the second source region from the first drain region, a third active region being formed between the second drain region and second source region, the third active region having a same width as the second active region, a third gate electrode finger disposed over the third active region.

In some embodiments, the transistor further comprises a third source region on an opposite side of the second drain region from the second source region, a fourth active region being formed between the third source region and second drain region, the fourth active region having a same width as the first active region, a fourth gate electrode finger disposed over the fourth active region.

In some embodiments, the third source region has the same width as the first source region.

In some embodiments, the transistor further comprises a drain bond pad disposed between a portion of the third source region and a portion of the first source region.

In some embodiments, the second drain region includes a widthwise extension on a side the second drain region opposite the second source region, the widthwise extension having a smaller length than the length of a remainder of the second drain region.

In some embodiments, the transistor further comprises a drain bond pad disposed at a position displaced in a lengthwise direction from the widthwise extension and displaced in a widthwise direction from a portion of the remainder of the second drain region.

In some embodiments, the remainder of the second drain region has a greater width than the second source region.

In some embodiments, the second source region has a greater width than the first source region.

In some embodiments, the second active region has a greater width than the first active region.

In some embodiments, the transistor further comprises a second drain region disposed on a side of the second source region opposite the side of the second source region on which the first drain region is disposed.

In some embodiments, the second drain region includes a widthwise extension on a same side of the second drain region as the second source region, the widthwise extension having a smaller length than the length of a remainder of the second drain region.

In some embodiments, the second drain region has a greater width than the remainder of the second drain region but a lesser width than a combined width of the remainder of the second drain region and the widthwise extension.

In some embodiments, the transistor further comprises two drain bond pads, portions of each of the first drain region, second source region, and second drain region being disposed between the two drain bond pads.

In some embodiments, the transistor further comprises a drain tie electrically connecting the two drain bond pads and being displaced widthwise from the second source region but including at least a portion at a same lengthwise position along the transistor as the second source region.

In some embodiments, the transistor further comprises a third source region on an opposite side of the second drain region, a third drain region on an opposite side of third source region from the second drain region, and a fourth source region on an opposite side of the third drain region from the third source region, an active region between the fourth source region and the third drain region having a greater width than the first active region.

In some embodiments, the active region between the fourth source region and the third drain region has a greater width than the second active region.

In some embodiments, the transistor forms a portion of a power amplifier.

In some embodiments, the transistor is disposed in an electronic device.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
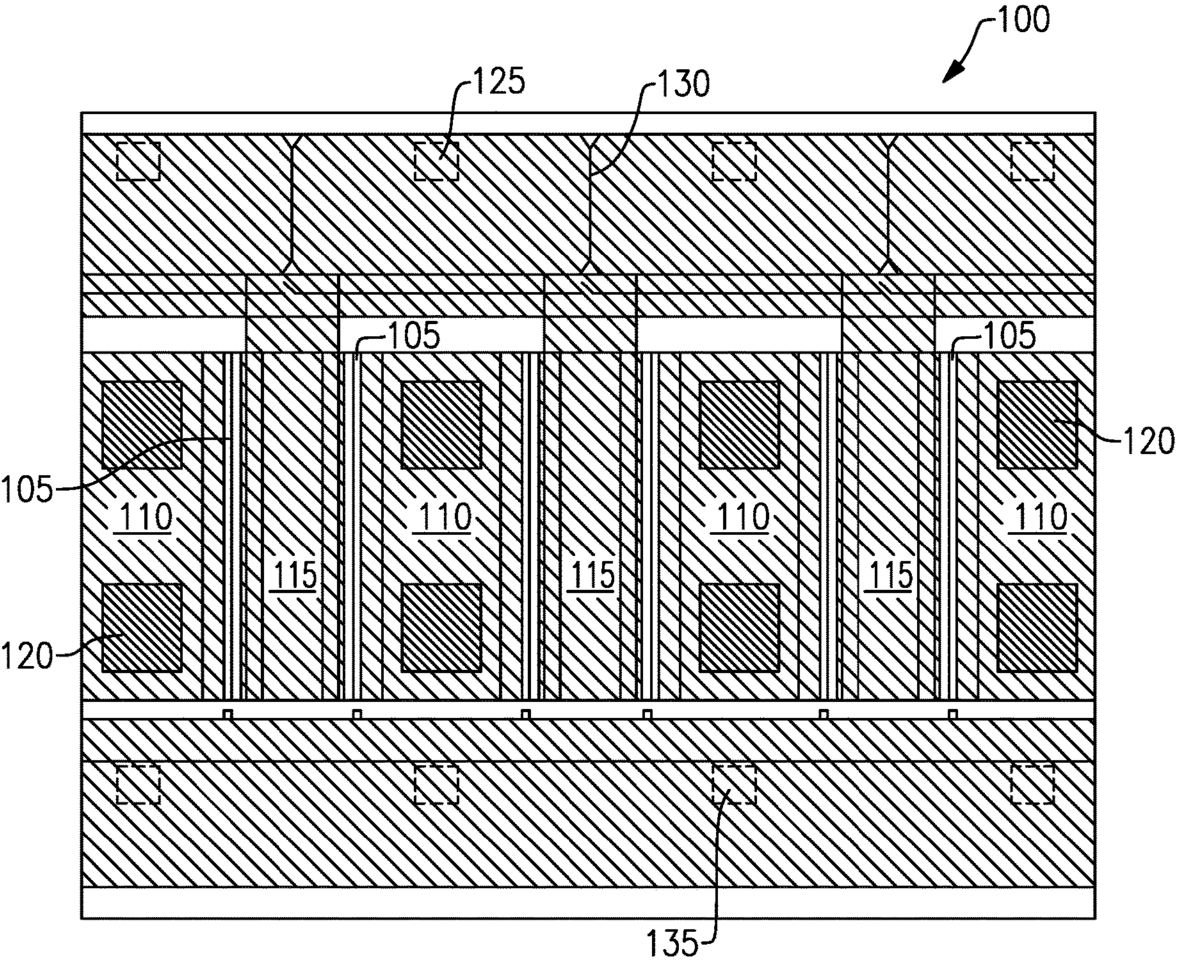
FIG. 1 illustrates an example of a transistor including multiple gate electrode fingers with equal widths.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Aspects and embodiments disclosed herein are generally directed to high power transistors with gate electrode arrangements configured to optimize the active area of the transistor within a given transistor size and to facilitate reduction or dissipation of heat generated in the transistors during operation.

FIG. 1 illustrates one example of a configuration of a transistor 100 including multiple gate electrode fingers 105 between source 110 and drain 115 regions. The flow of electrical carriers (such as electrons) from source to drain regions is controlled by the gate fingers 105. The provision of multiple gate electrode fingers 105 may increase the amount of power the transistor 100 can handle as compared to a similar transistor with a single gate. These devices may be used for radio frequency (RF) and millimeter-wave (mmW) power amplifiers (PA), particularly in high power implementations (>2 W average output power). Implementations utilizing such devices may include cellular base station, radar, satellite communications, etc., and may also include WIFI routers and cellular handsets.

In the transistor 100 each of the gate electrode fingers 105 have equal widths, width being defined as the vertical direction in the figures. Equal widths of each gate electrode finger cover different active areas of the transistor. The source regions 110 may be connected to ground by through wafer vias (TWVs) 120. Drain bond pads 125 are provided on one side of the transistor and are electrically connected to the drain regions 115. Each of the drain bond pads 125 may be electrically connected to one another, optionally through metal traces 130 of the die. Gate bond pads 135 are provided on the opposite side of the transistor 100 from the drain bond pads 125 and are electrically connected to the gate electrode fingers 105. Each of the gate bond pads 135 may be electrically connected to one another, optionally through resistive portions 142 (resistors) in metal traces 130, 140 of the die (See FIG. 4). The transistor 100, as well as the other transistor designs disclosed herein may be implemented as a gallium nitride (GaN) on silicon carbide (SiC) device, a GaN on silicon device, a High Electron Mobility Transistor (HEMT), a Pseudomorphic High Electron Mobility Transistor (pHEMT) or any other form of transistor having any other form of substrate. In some embodiments, the transistor 100, as well as the other transistor designs disclosed herein may be implemented as a flip-chip device.

Figure 2:
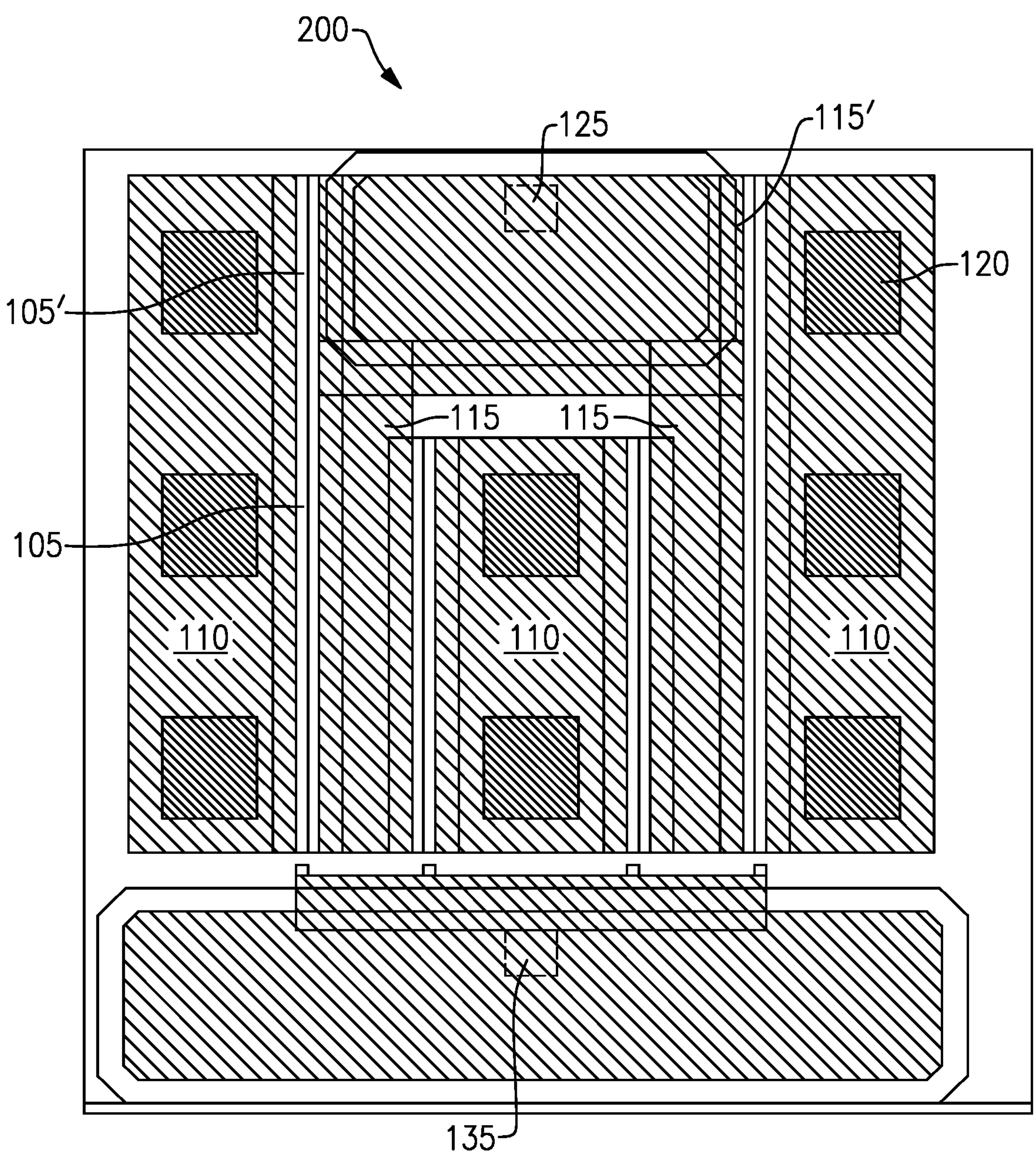
FIG. 2 illustrates an example of a transistor including multiple gate electrode fingers with unequal widths.

The active area of the transistor 100, and hence the amount of power that it can handle, may be improved, by, for example, widening one or more of the gate electrode fingers 105. FIG. 2 illustrates an example of a configuration of a transistor 200 including multiple gate electrode fingers 105 between source 110 and drain 115 regions where at least some of the gate electrode fingers 105' have been elongated. The drain bond pad 125 has been reduced in size and the outside source regions 110 have been extended. Extended portions of the drain regions 115' have also been provided to supply current across the gate regions defined by the elongated portions of the gate electrode fingers 105' and into the source regions 110. Although FIG. 2 illustrates a transistor with three source regions 110 and two drain regions 115, the number of source and drain regions and associated gate electrode fingers 105, 105' may be increased to include, for example, four source regions 110 and three drain regions 115, such as included in the transistor 100 of FIG. 1. Providing a transistor with extended portions of gate electrode fingers as in the example of FIG. 2 may help spread heat generated during operation of the transistor over a larger area from which it may be dissipated to keep the operating temperature of the transistor within an acceptable range.

Figure 3:
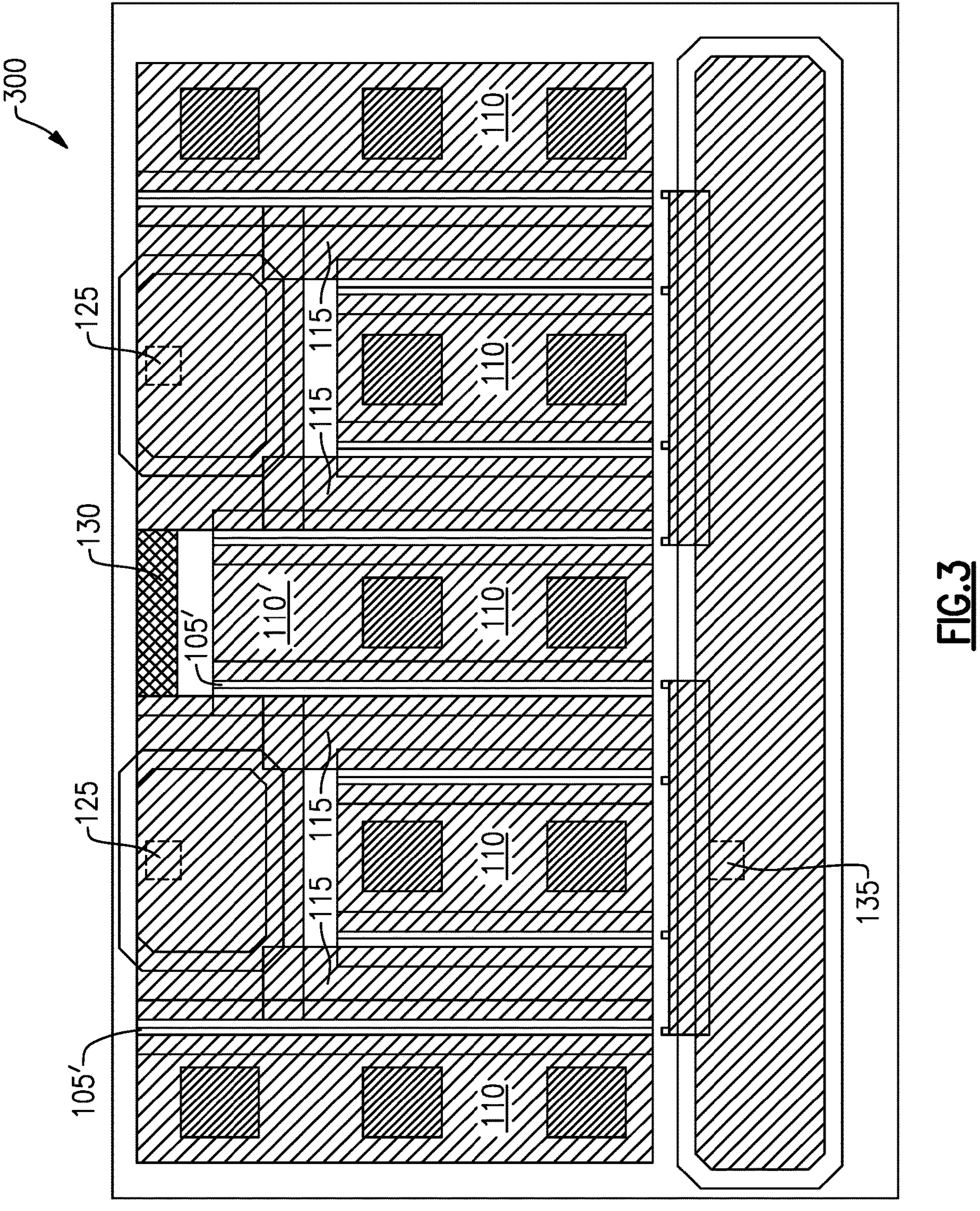
FIG. 3 illustrates an example of a transistor including multiple gate electrode fingers with unequal widths and source regions of different sizes and shapes.

In another embodiment, illustrated in FIG. 3 and indicated generally at 300, a transistor may include not only extended gate electrode fingers 105' adjacent extended source regions 110 on the sides of the transistor as in the transistor 200 of FIG. 2, but also (or alternatively) extended gate electrode fingers 105' adjacent extended regions of source regions 110' in an interior region of the transistor. The extended gate electrode fingers 105' adjacent the extended regions 110' of the source regions in the interior region of the transistor may have a different width, for example, may be shorter, than the extended gate electrode fingers 105' adjacent extended source regions 110 on the sides of the transistor. In the transistor 300 of FIG. 3 there are two drain bond pads 125 electrically coupled by a metal trace 130 of the die, which may be referred to as a drain tie herein.

Figure 4:
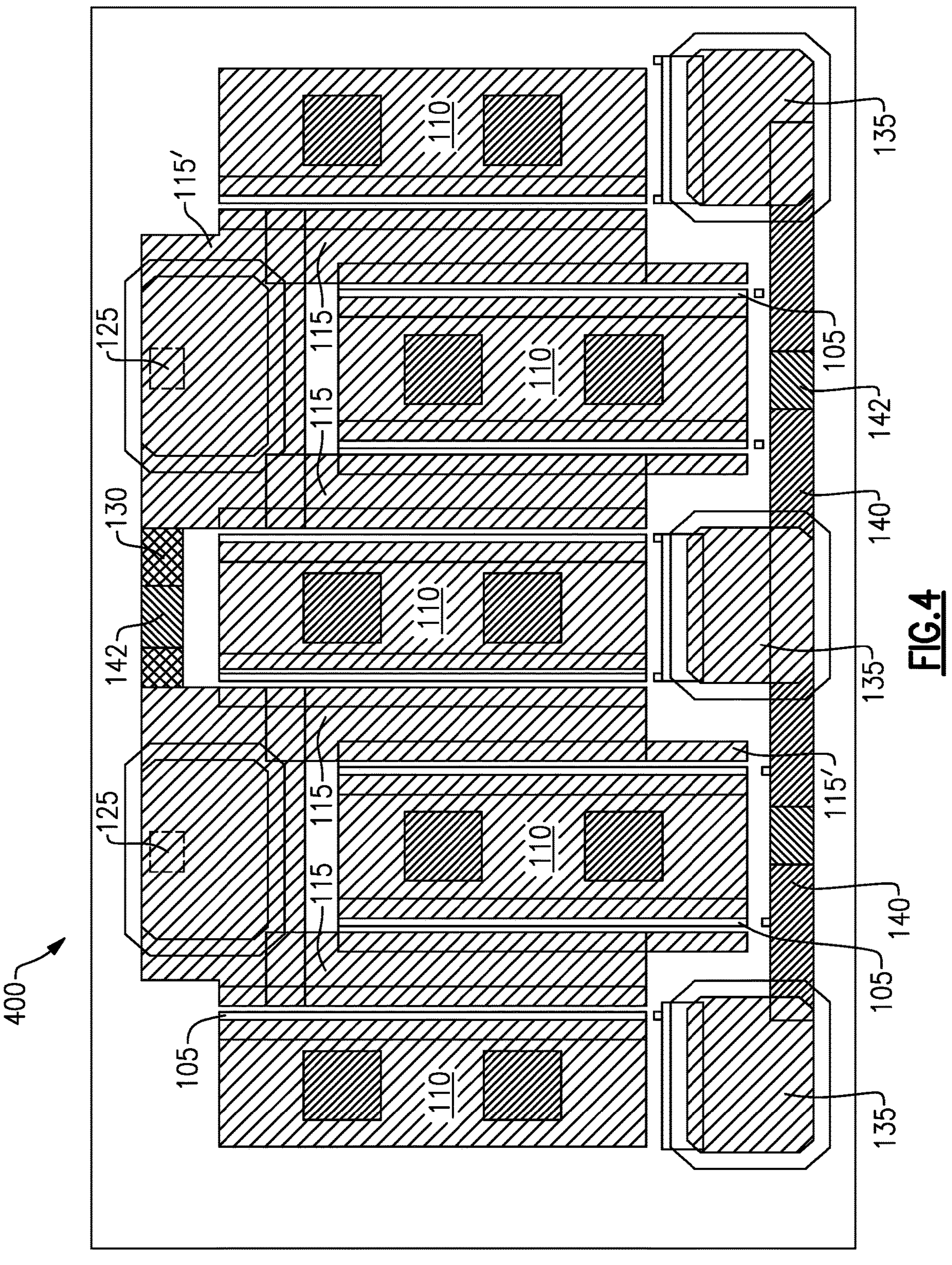
FIG. 4 illustrates an example of a transistor including staggered source and drain regions.

Another method of increasing active area in a transistor while also improving thermal management involves staggering the source and drain regions across the transistor. FIG. 4 illustrates one example of this. In transistor 400 of FIG. 4 the source and drain regions 110, 115 and associated gate electrode fingers 105 are staggered in a widthwise direction (the vertical direction in FIG. 4) along a lengthwise direction (the horizontal direction in FIG. 4) across the transistor. Each of the gate electrode fingers 105 has the same width, which may provide the separate portions of the transistor with the same frequency response. Like in the transistor 300 of FIG. 3, the drain bond pads 125 are split and electrically coupled by a drain tie 130 (a metal trace) to accommodate the extended portion of the central source region 110. The gate bond pad 135 is also split into three gate bond pads 135 to accommodate the extended portions of the source regions 110 on either side of the central source region 110. The gate bond pads 135 are electrically coupled by metal traces 140 of the die, optionally through resistors 142. Like in the transistors 200, 300 of FIGS. 2 and 3, the outermost drain regions 115 include extended portions 115' that are shorter than the remainder of the outermost drain regions 115 and that are electrically connected to the extended portions of the outermost source regions 110 on the drain bond pad side of the transistor 400 when the transistor 400 is in an "on" state. Similarly, the inner drain regions 115 include extended portions 115' that are shorter than the remainder of the inner drain regions 115 and that are electrically connected to the extended portions of the source regions 110 on either side of the central source region 110 on the gate bond pad side of the transistor 400 when the transistor 400 is in an "on" state. Staggering of the source regions 110 and drain regions 115 in the transistor 400 may cause the regions of the source/drain interfaces that generate the most heat during operation to be widthwise offset from one another for each source/drain pair. This may spread heat generated during operation over a larger area of the transistor and offset the areas of highest temperature (the middle of the gate finger in the vertical direction in FIG. 4) to minimize thermal coupling between gate fingers, thus reducing the potential for localized heating and facilitating dissipation of heat through the substrate upon which the transistor 400 is formed.

Figure 5:
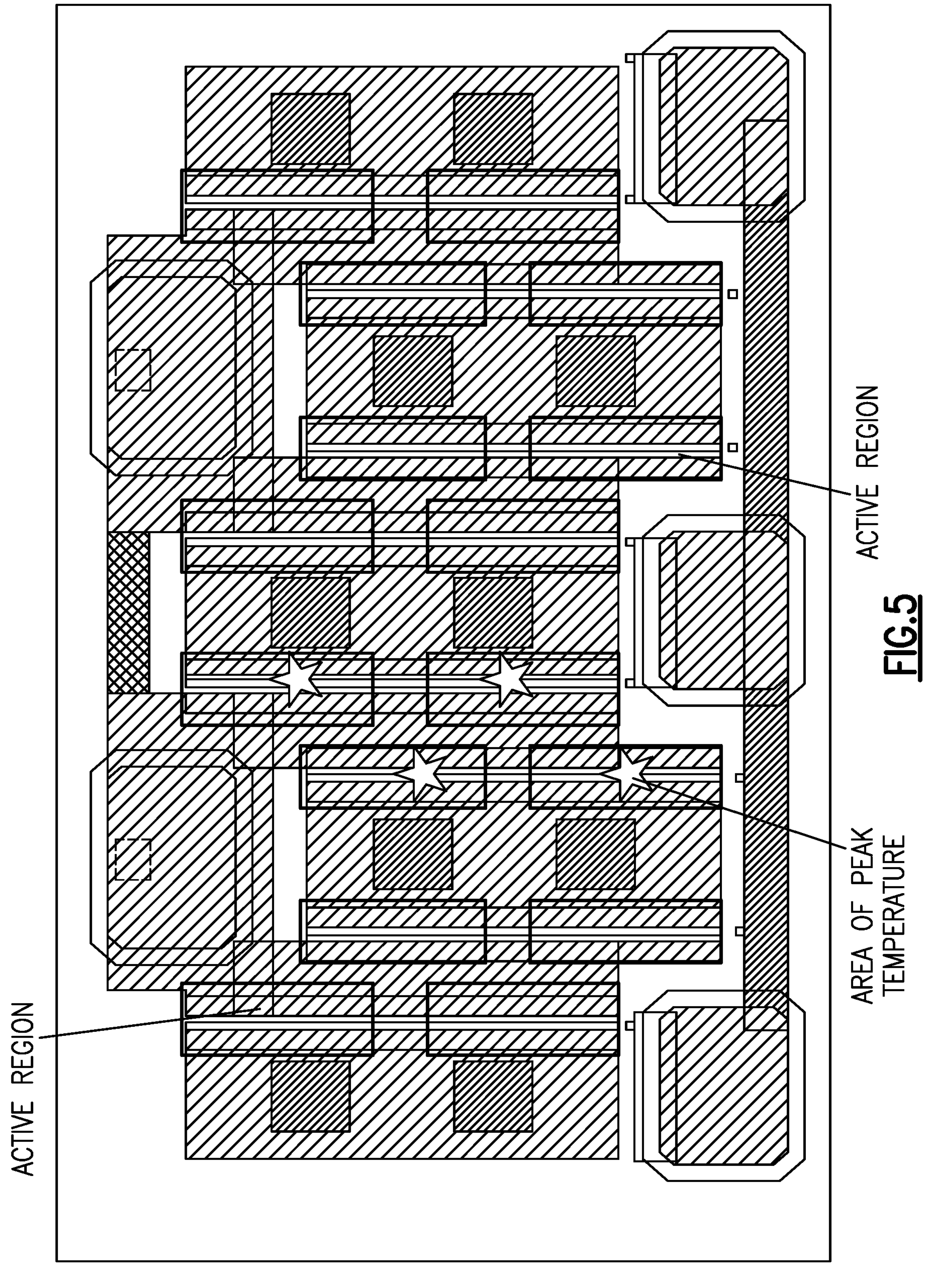
FIG. 5 illustrates an example of a transistor including staggered source and drain regions where the active region including the source, channel region, and drain regions are broken into multiple sub-regions.

To further increase thermal dissipation of a transistor such as transistor 400 of FIG. 4, the active regions between each source and drain may be split into one of more active regions. FIG. 5 illustrates a transistor similar to transistor 400 of FIG. 4 wherein the active regions between sources and drains have been split into the boxed areas. Portions of the source and/or drain regions between the active regions may be rendered inactive by, for example, a reduction in dopant concentration, formation of isolation regions (e.g., dielectric trenches), or other methods that may be known in the art. The portions of the active regions that would heat up the most during operation are at or proximate the centers of the active regions and are designated by stars in FIG. 5. Splitting the active regions into smaller sections reduces the peak temperature along the individual gate electrode fingers reached during operation. Thermal mutual coupling between parallel gate electrode fingers can then be further minimized by staggering the active regions between fingers. In the configuration illustrated in FIG. 5 the areas of peak temperature (the stars) are aligned with adjacent sections without active regions and thus without heat generation. FIG. 5 illustrates split regions with two active regions, however, in other embodiments, there may be more than two split active regions, active regions of different dimensions, and/or gaps between active regions of different sizes to optimize heat distribution across the entire transistor or die. The benefit of utilizing split active regions as illustrated in FIG. 5 is that this provides for reducing or mitigating thermal resistance increase (temperature rise) while maintaining or increasing gate electrode finger width, as compared to transistors without staggered source and/or drain regions, for example, as in the transistor 100 of FIG. 1. A lower temperature in the active areas provides higher reliability and higher transistor performance (such as higher RF gain).

Figure 6A:
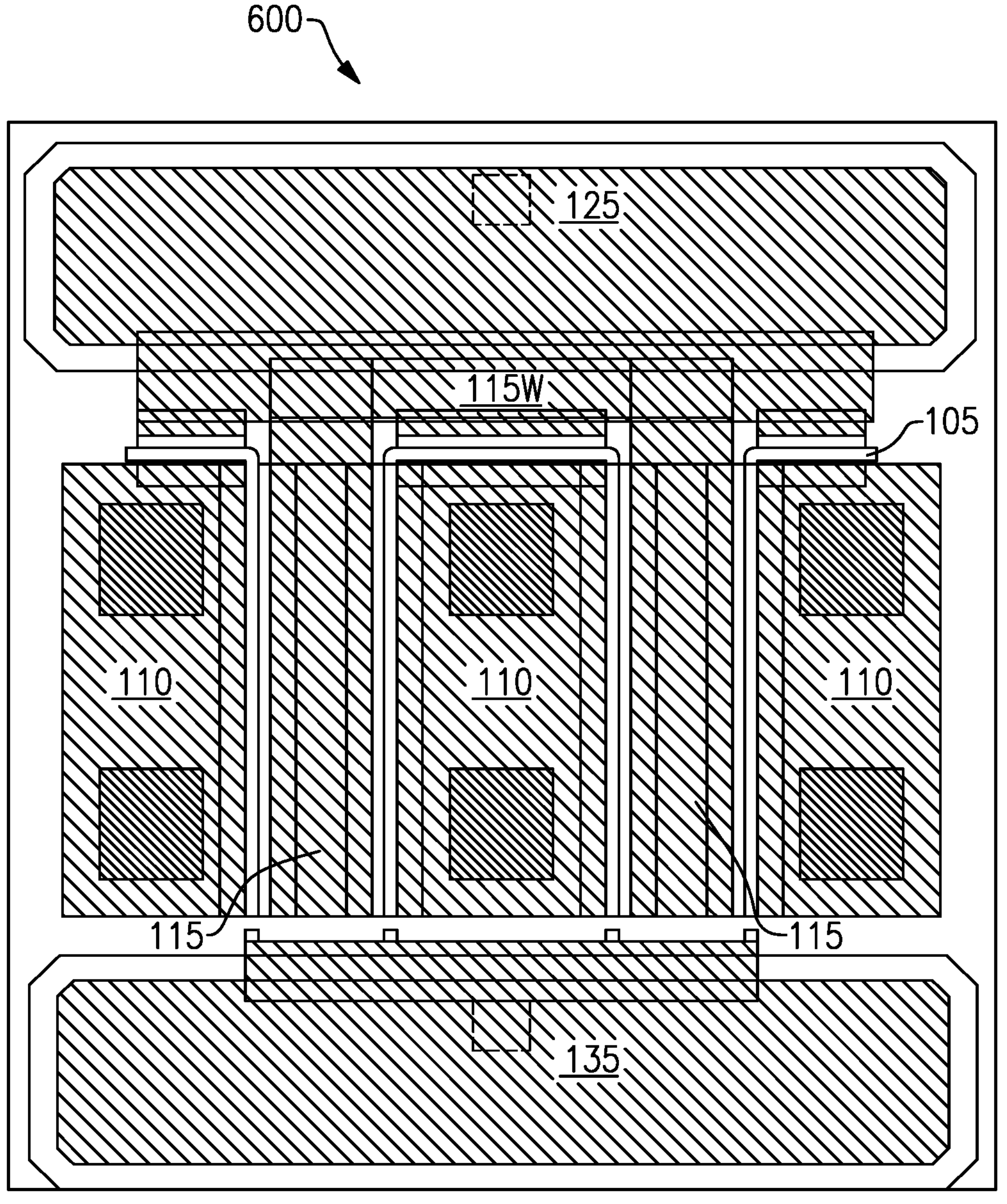
FIG. 6A illustrates an example of a transistor including drain regions disposed adjacent both lengthwise and widthwise extending sides of source regions.
Figure 6B:
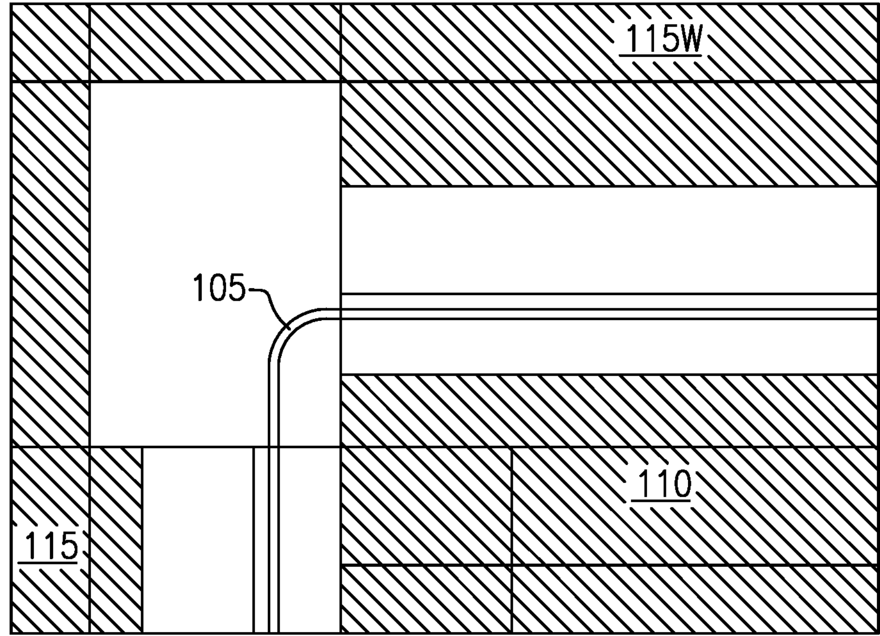
FIG. 6B illustrates a gate electrode finger curving around a corner of one of the source regions of the transistor of FIG. 6A.
Figure 6C:
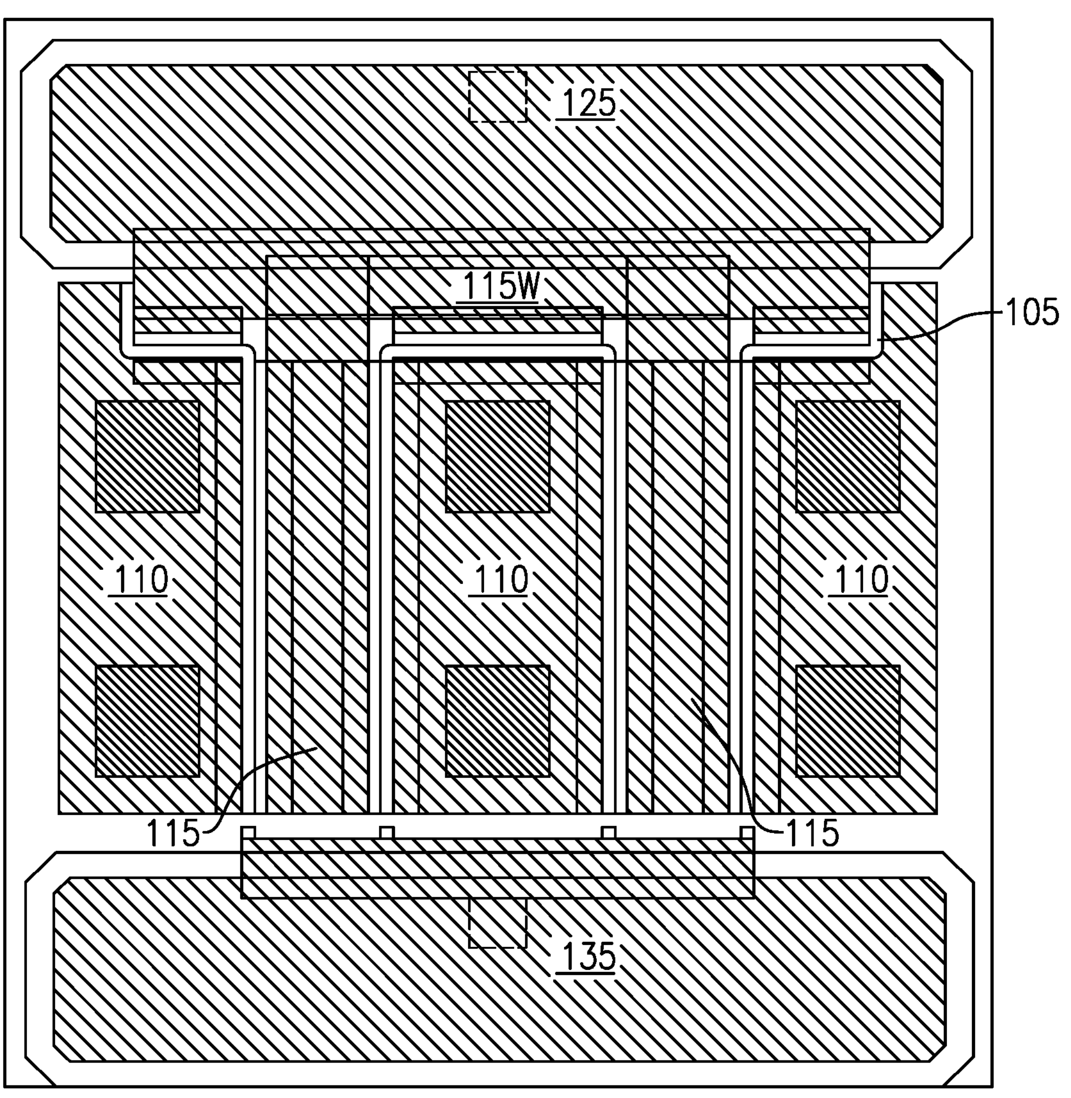
FIG. 6C illustrates the transistor of FIG. 6A with additional source region extensions.

In another method of increasing the total width of a transistor (and thus the total current and power handling of a transistor), gate electrode fingers may be provided not only between drain regions and source regions displaced from one another in only a single dimension, for example, a lengthwise direction (a horizontal direction in the figures) but between drain regions and source regions displaced from one another in two dimensions, for example, a lengthwise direction and a widthwise direction. FIG. 6A illustrates an example of a transistor 600 including this feature. The transistor 600 includes source regions 110 and drain regions 115 alternating in a lengthwise direction across the transistor and gate electrode fingers 105 defining active regions between the source regions 110 and drain regions 115. The transistor 600 further includes an additional drain region 115*w* displaced in a widthwise direction (the vertical direction in FIG. 6A) from the source regions 110. The additional drain region 115*w* may have a maximum dimension that is orthogonal to a maximum dimension of the lengthwise arranged drain regions 115. The gate electrode fingers 105 between the lengthwise alternating source regions 110 and drain regions 115 extend around a corner of each source region 110 (See FIG. 6B) and between each source region 110 and the additional drain region 115*w*. Such an electrode configuration may be referred to as an "L-gate." The lengthwise arranged drain regions 115 and the additional drain region 115*w* may be electrically connected to form one larger composite drain region 115 which, in the example of FIG. 6 is pi-shaped. The lengthwise arranged drain regions 115 may be in electrical contact with the drain bond pad through the additional drain region 115*w*. In a modification to the transistor of FIG. 6A, outside portions of the outer source regions 110 may be extended in the widthwise direction and may form additional active regions between the extended portions and the outer sides of the additional drain region 115*w*. The gate electrode fingers 105 could be further extended to cover these additional active regions. An example of this modification is illustrated in FIG. 6C.

Figure 7:
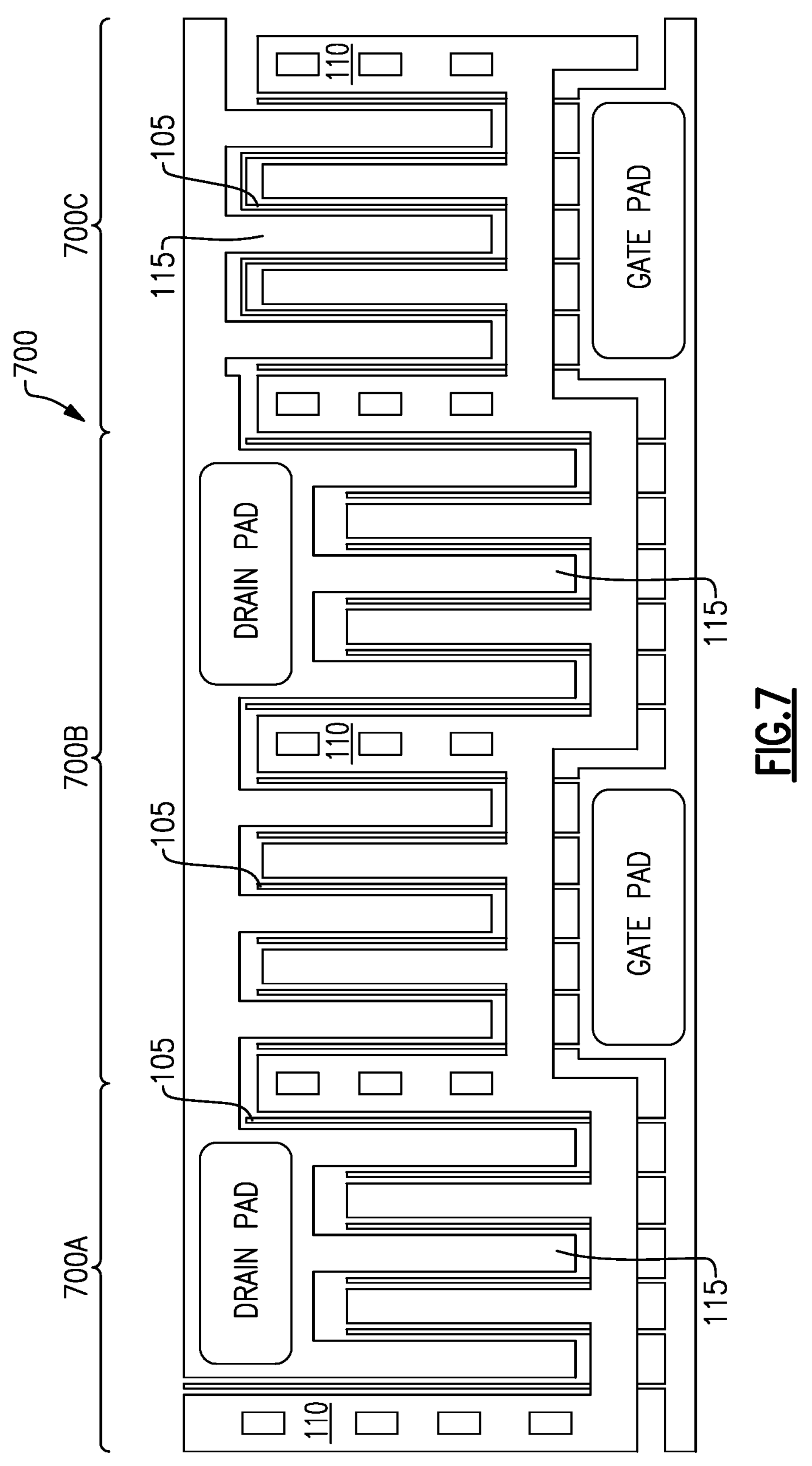
FIG. 7 illustrates an example of a transistor including features of multiple of the other examples above.

In other embodiments, features of any one or more of the transistor designs disclosed above may be combined in a single transistor. For example, as illustrated in FIG. 7 an example of a transistor 700 may include a first portion 700A including different gate electrode finger widths/different active area widths between different sources and drains, similar to the transistor 200 of FIG. 2. A second portion 700B of the transistor 7000 may include staggered/widthwise offset source regions, similar to the transistor 400 of FIG. 4. A third portion 700C of the transistor may include "L gates" similar to the transistor 600 of FIG. 6A.

Embodiments of the transistors disclosed herein can be used in a wide variety of electronic devices, for example, communication devices.

Figure 8:
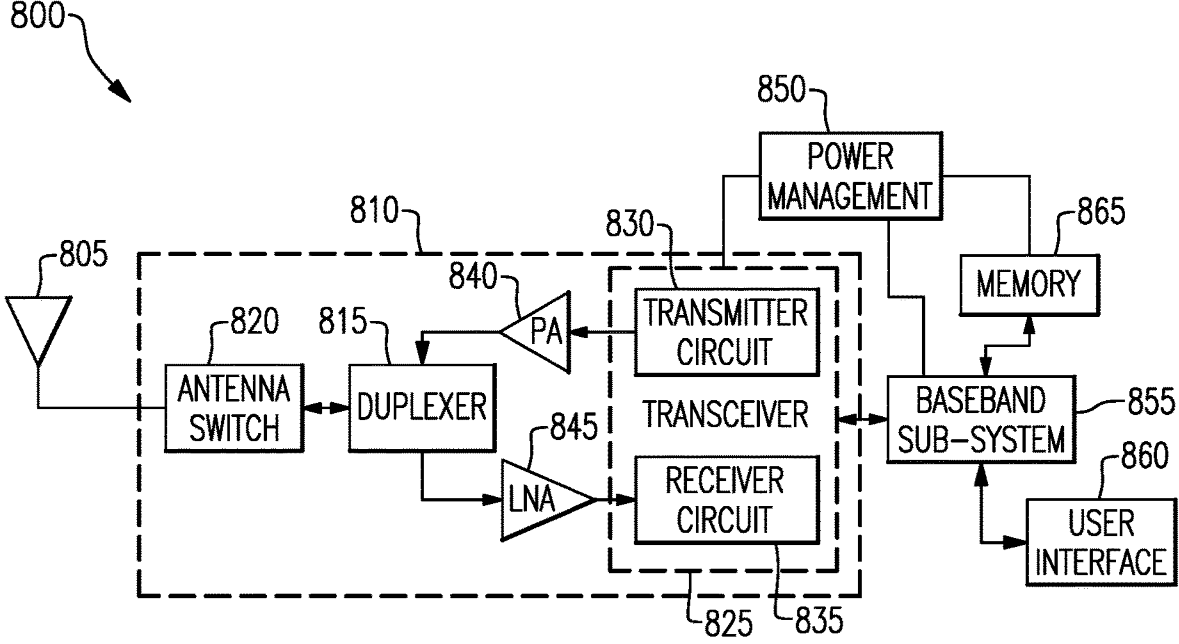
FIG. 8 is a block diagram of one example of a wireless device including examples of transistors disclosed herein.

FIG. 8 is a block diagram of one example of a wireless device 800. The wireless device 800 can be a cellular phone, smart phone, tablet, modem, communication network or any other portable or non-portable device configured for voice or data communication. The wireless device 800 can receive and transmit signals from an antenna 805. The wireless device includes a front-end module 810. The front-end module 810 includes a duplexer 815. In the example shown in FIG. 8 the front-end module 810 further includes an antenna switch 820, which can be configured to switch between different frequency bands or modes, such as transmit and receive modes, for example. The antenna switch 820 can include one or more examples of the transistors disclosed herein. In the example illustrated in FIG. 8, the antenna switch 820 is positioned between the duplexer 815 and the antenna 805; however, in other examples the duplexer 815 can be positioned between the antenna switch 820 and the antenna 805. In other examples the antenna switch 820 and the duplexer 815 can be integrated into a single component.

The front-end module 810 includes a transceiver 825 that is configured to generate signals for transmission or to process received signals. The transceiver 825 can include a transmitter circuit 830, which can be connected to an input node of the duplexer 815, and the receiver circuit 835, which can be connected to an output node of the duplexer 815, as shown in the example of FIG. 8.

Signals generated for transmission by the transmitter circuit 830 are received by a power amplifier (PA) module 840, which amplifies the generated signals from the transceiver 825. The power amplifier module 840 can include one or more power amplifiers. The one or more power amplifiers can include one or more examples of the transistors disclosed herein. The power amplifier module 840 can be used to amplify a wide variety of RF or other frequency-band transmission signals. For example, the power amplifier module 840 can receive an enable signal that can be used to pulse the output of the power amplifier to aid in transmitting a wireless local area network (WLAN) signal or any other suitable pulsed signal. The power amplifier module 840 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 840 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 8, the front-end module 810 may further include a low noise amplifier module 845, which amplifies received signals from the antenna 805 and provides the amplified signals to the receiver circuit 835 of the transceiver 825.

The wireless device 800 of FIG. 8 further includes a power management sub-system 850 that is connected to the transceiver 825 and manages the power for the operation of the wireless device 800. The power management system 850 can also control the operation of a baseband sub-system 855 and various other components of the wireless device 200. The power management system 850 can include, or can be connected to, a battery (not shown) that supplies power for the various components of the wireless device 800. The power management system 850 can further include one or more processors or controllers that can control the transmission of signals, for example. In one embodiment, the baseband sub-system 855 is connected to a user interface 860 to facilitate various input and output of voice and/or data provided to and received from the user. The baseband sub-system 855 can also be connected to memory 865 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A transistor comprising:

a first drain region;

a first source region of the transistor disposed on a first side of the first drain region of the transistor, a first active region of the transistor being formed between the first drain region of the transistor and the first source region of the transistor;

a second source region of the transistor disposed on a second side of the first drain region of the transistor opposite the first side, a second active region of the transistor being formed between the first drain region of the transistor and the second source region of the transistor, the first active region of the transistor having a different width than the second active region of the transistor;

a first gate electrode finger of the transistor disposed over the first active region of the transistor; and a second gate electrode finger of the transistor disposed over the second active region of the transistor.

2. The transistor of claim 1 wherein the first source region of the transistor has a different width than the second source region of the transistor.

3. The transistor of claim 1 wherein the first drain region of the transistor includes a widthwise extension on the first side of the first drain region of the transistor that has a smaller length than the length of a remainder of the first drain region of the transistor.

4. The transistor of claim 3 further comprising a drain bond pad of the transistor disposed at a position displaced in a lengthwise direction from the widthwise extension and displaced in a widthwise direction from a portion of the remainder of the first drain region of the transistor.

5. The transistor of claim 4 wherein the remainder of the first drain region of the transistor has a greater width than the second source region of the transistor.

6. The transistor of claim 3 wherein the first source region of the transistor has a greater width than the second source region of the transistor.

7. The transistor of claim 1 further comprising a second drain region of the transistor on an opposite side of the second source region of the transistor from the first drain region of the transistor, a third active region of the transistor being formed between the second drain region of the transistor and second source region of the transistor, the third active region of the transistor having a same width as the second active region of the transistor, a third gate electrode finger of the transistor disposed over the third active region of the transistor.

8. The transistor of claim 7 further comprising a third source region of the transistor on an opposite side of the second drain region of the transistor from the second source region of the transistor, a fourth active region of the transistor being formed between the third source region of the transistor and second drain region of the transistor, the fourth active region of the transistor having a same width as the first active region of the transistor, a fourth gate electrode finger of the transistor disposed over the fourth active region of the transistor.

9. The transistor of claim 8 further comprising a drain bond pad of the transistor disposed between a portion of the third source region of the transistor and a portion of the first source region of the transistor.

10. The transistor of claim 7 wherein the second drain region of the transistor includes a widthwise extension on a side the second drain region of the transistor opposite the second source region of the transistor, the widthwise extension having a smaller length than the length of a remainder of the second drain region of the transistor.

11. The transistor of claim 10 further comprising a drain bond pad of the transistor disposed at a position displaced in a lengthwise direction from the widthwise extension and displaced in a widthwise direction from a portion of the remainder of the second drain region of the transistor.

12. The transistor of claim 10 wherein the remainder of the second drain region of the transistor has a greater width than the second source region of the transistor.

13. The transistor of claim 1 wherein the second source region of the transistor has a greater width than the first source region of the transistor and the second active region of the transistor has a greater width than the first active region of the transistor.

14. The transistor of claim 13 further comprising a second drain region of the transistor disposed on a side of the second source region of the transistor opposite the side of the second source region of the transistor on which the first drain region of the transistor is disposed.

15. The transistor of claim 14 wherein the second drain region of the transistor includes a widthwise extension on a same side of the second drain region of the transistor as the second source region of the transistor, the widthwise extension having a smaller length than the length of a remainder of the second drain region of the transistor.

16. The transistor of claim 15 wherein the second drain region of the transistor has a greater width than the remainder of the second drain region of the transistor but a lesser width than a combined width of the remainder of the second drain region of the transistor and the widthwise extension.

17. The transistor of claim 16 further comprising two drain bond pads of the transistor, portions of each of the first drain region of the transistor, second source region of the transistor, and second drain region of the transistor being disposed between the two drain bond pads of the transistor.

18. The transistor of claim 17 further comprising a drain tie of the transistor electrically connecting the two drain bond pads of the transistor and being displaced widthwise from the second source region of the transistor but including at least a portion at a same lengthwise position along the transistor as the second source region of the transistor.

19. The transistor of claim 14, further comprising a third source region of the transistor on an opposite side of the second drain region of the transistor, a third drain region of the transistor on an opposite side of third source region of the transistor from the second drain region of the transistor, and a fourth source region of the transistor on an opposite side of the third drain region of the transistor from the third source region of the transistor, an active region of the transistor between the fourth source region of the transistor and the third drain region of the transistor having a greater width than the first active region of the transistor.

20. The transistor of claim 19 wherein the active region of the transistor between the fourth source region of the transistor and the third drain region of the transistor has a greater width than the second active region of the transistor.

* * * * *